US009711484B2

(12) United States Patent
Paek et al.

(10) Patent No.: US 9,711,484 B2
(45) Date of Patent: Jul. 18, 2017

(54) SEMICONDUCTOR PACKAGE WITH SEMICONDUCTOR DIE DIRECTLY ATTACHED TO LEAD FRAME AND METHOD

(71) Applicant: Amkor Technology, Inc., Tempe, AZ (US)

(72) Inventors: Jong Sik Paek, Incheon (KR); Doo Hyun Park, Gyeonggi-do (KR); Wang Gu Lee, Gyeonggi-do (KR); Yong Song, Seoul (KR); Sung Geun Kang, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/725,156

(22) Filed: May 29, 2015

(65) Prior Publication Data

US 2016/0141229 A1    May 19, 2016

(30) Foreign Application Priority Data

Nov. 13, 2014    (KR) .................. 10-2014-0158009

(51) Int. Cl.
*H01L 23/495* (2006.01)
*H01L 23/48* (2006.01)
(Continued)

(52) U.S. Cl.
CPC .......... *H01L 24/83* (2013.01); *H01L 23/3107* (2013.01); *H01L 23/49541* (2013.01);
(Continued)

(58) Field of Classification Search
CPC ......... H01L 21/76871; H01L 21/76873; H01L 21/76874; H01L 2224/0346;
(Continued)

(56) References Cited

U.S. PATENT DOCUMENTS 4,141,782 A * 2/1979 Dugan ................ H01L 21/4839
216/48
5,528,078 A * 6/1996 Shin .................. H01L 23/49572
257/666
(Continued)

FOREIGN PATENT DOCUMENTS

JP    1998-303231    11/1998
JP    2010-171271 A    8/2010
(Continued)

OTHER PUBLICATIONS

Peter Dietrich, Trends in Automotive Power Semiconductor Packaging; Microelectronics Reliability 53, pp. 1681-1686, 2013.
(Continued)

*Primary Examiner* — Teresa M Arroyo
(74) *Attorney, Agent, or Firm* — Kevin B. Jackson

(57) ABSTRACT

In one embodiment, a semiconductor package includes a semiconductor die having conductive pads. A lead frame is directly connected to the conductive pads using an electro-chemically formed layer or a conductive adhesive layer thereby facilitating an electrical connection between the conductive pads of the semiconductor die and the lead frame without using separate wire bonds or conductive bumps.

14 Claims, 5 Drawing Sheets

(51) Int. Cl.
*H01L 23/52* (2006.01)
*H01L 29/40* (2006.01)
*H01L 23/00* (2006.01)
*H01L 23/31* (2006.01)

(52) U.S. Cl.
CPC .. *H01L 23/49548* (2013.01); *H01L 23/49551* (2013.01); *H01L 23/49582* (2013.01); *H01L 24/27* (2013.01); *H01L 24/32* (2013.01); *H01L 2224/1354* (2013.01); *H01L 2224/27462* (2013.01); *H01L 2224/27464* (2013.01); *H01L 2224/32245* (2013.01); *H01L 2224/82355* (2013.01)

(58) Field of Classification Search
CPC . H01L 2224/03462; H01L 2224/03464; H01L 2224/03825; H01L 2224/1146; H01L 2224/11462; H01L 2224/11464; H01L 2224/11825; H01L 2224/2746; H01L 2224/27462; H01L 2224/27464; H01L 2224/27825; H01L 2224/35125; H01L 2224/35825; H01L 2224/43125; H01L 2224/1354; H01L 2224/2954; H01L 2224/3754; H01L 2224/4554; H01L 2224/82355; H01L 2224/82375; H01L 2224/82395; H01L 2224/83355; H01L 2224/83375; H01L 2224/83395; H01L 2224/84355; H01L 2224/84375; H01L 2224/84395; H01L 2224/85355; H01L 2224/85375; H01L 2224/85395; H01L 2224/86355; H01L 2224/86375; H01L 2224/86395
USPC ........ 257/778, E21.586; 438/FOR. 390, 584; 205/118
See application file for complete search history.

(56) References Cited

U.S. PATENT DOCUMENTS

| | | | | |
|---|---|---|---|---|
| 5,723,900 | A * | 3/1998 | Kojima | H01L 23/3107 257/666 |
| 6,246,111 | B1 * | 6/2001 | Huang | H01L 21/565 257/666 |
| 8,124,459 | B2 * | 2/2012 | Yoon | H01L 21/4832 257/666 |
| 2001/0017412 | A1 * | 8/2001 | Asazu | H01L 24/10 257/737 |
| 2001/0040290 | A1 * | 11/2001 | Sakurai | H01L 23/3128 257/737 |
| 2002/0090756 | A1 * | 7/2002 | Tago | H01L 23/481 438/108 |
| 2002/0152798 | A1 * | 10/2002 | Leverrier | H01L 24/81 73/31.05 |
| 2002/0153257 | A1 * | 10/2002 | Leverrier | H01L 24/81 205/118 |
| 2006/0033517 | A1 * | 2/2006 | Khandros | B23K 20/004 324/755.01 |
| 2007/0117475 | A1 * | 5/2007 | Tu | H01L 23/49582 439/884 |
| 2007/0262432 | A1 * | 11/2007 | Otremba | H01L 23/3142 257/678 |
| 2008/0299705 | A1 * | 12/2008 | Lee | H01L 23/3107 438/108 |
| 2010/0187678 | A1 | 7/2010 | Kajiwara et al. | |
| 2011/0115069 | A1 | 5/2011 | Teh et al. | |
| 2012/0061822 | A1 * | 3/2012 | Pagaila | H01L 21/4832 257/737 |
| 2012/0153447 | A1 * | 6/2012 | Jiang | H01L 21/563 257/673 |
| 2012/0261689 | A1 * | 10/2012 | Appelt | H01L 21/4832 257/98 |
| 2013/0307144 | A1 * | 11/2013 | Yu | H01L 24/81 257/737 |
| 2014/0124914 | A1 * | 5/2014 | Lin | H01L 21/28587 257/712 |

FOREIGN PATENT DOCUMENTS

| | | |
|---|---|---|
| KR | 10-2004-0009581 A | 1/2004 |
| KR | 20040009581 A * | 1/2004 |
| WO | 2007034893 | 3/2007 |

OTHER PUBLICATIONS

Office Action received from Korean Patent Office in Korean; English Translation Not Available; Date:Apr. 27, 2016; 5 pages.
Office Action and Search Report received from Taiwan Patent Office in Chinese; Non-certified English translation ncluded; Date:Jul. 5, 2016; 16 pages.
Notice of Allowance received from Korean Patent Office in Korean; English Translation Not Available; Date:Nov. 8, 2016; 3 pages.

* cited by examiner

SEMICONDUCTOR PACKAGE WITH SEMICONDUCTOR DIE DIRECTLY ATTACHED TO LEAD FRAME AND METHOD

CROSS-REFERENCE TO RELATED APPLICATIONS

This application claims priority from Korean Patent Application No. 10-2014-0158009 filed on Nov. 13, 2014 in the Korean Intellectual Property Office, and all the benefits accruing therefrom under 35 U.S.C. §119, the contents of which in its entirety are herein incorporated by reference.

BACKGROUND

The present invention relates, in general, to electronics, and more particularly, to semiconductor packages, structures thereof, and methods of forming semiconductor packages.

In general, a lead frame for a semiconductor package is manufactured by mechanically stamping or chemically etching a metal strip. The lead frame serves as a lead connecting a semiconductor die to an external circuit and as a frame that fixes the semiconductor package to the external circuit.

The lead frame can have various shapes according to trends toward high density and high integration of semiconductor dies and component mounting method. In order to electrically connect a semiconductor die and a lead frame, like a memory and a CPU, to each other, in the past the semiconductor package has been configured such that a bond pad of the semiconductor die and the lead frame were connected to each other by wire bonding or using conductive bumps.

The lead frame having the aforementioned configuration was electrically connected to the semiconductor die, followed by encapsulating using an encapsulant, thereby completing the semiconductor package. Several problems exist with such semiconductor packages, including extra manufacturing cost and time to complete the wire bonding or conductive bump processes, increased likelihood of reliability issues caused by damage during such processes, increased package heights, and poor performance including failures in high current applications.

Accordingly, it is desirable to have a method and structure that reduces the cost of connecting a semiconductor die to a leadframe, that reduces the likelihood of damage during manufacturing to improve reliability, and that improves performance in high current applications.

Figure 1A:
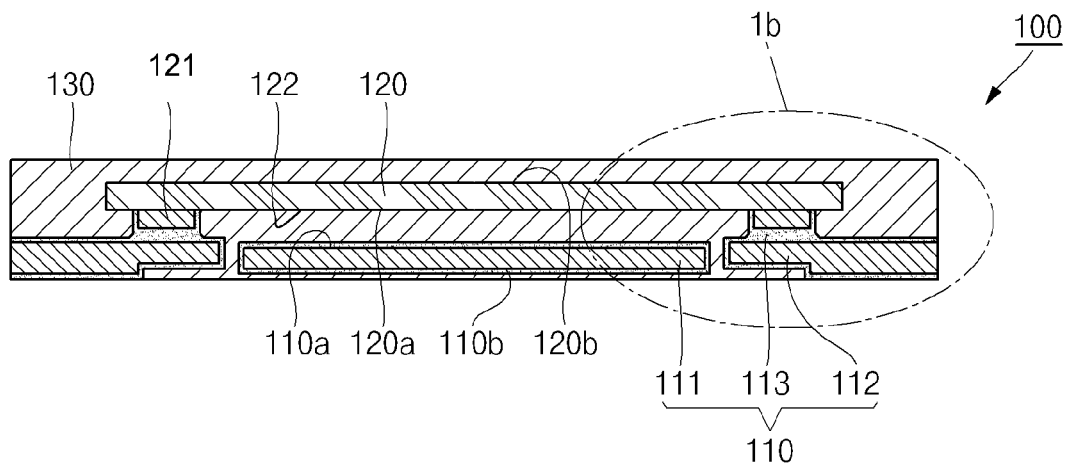
FIGS. 1A and 1B are a partial cross-sectional view and a partial enlarged cross-sectional view illustrating a semiconductor package according to an embodiment of the present invention.

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word approximately or substantially means a value of an element is expected to be close to a state value or position. However, as is well known in the art there are always minor variances preventing values or positions from being exactly stated. As used herein, the singular forms are intended to include the plural forms as well, unless the context clearly indicates otherwise. It will be understood that, although the terms first, second, etc. may be used herein to describe various members, elements, regions, layers and/or parts, these members, elements, regions, layers and/or parts are not be limited by these terms. These terms are only used to distinguish one member, element, region, layer and/or part from another member, element, region, layer and/or part. Thus, for example, a first member, element, region, layer and/or part discussed below could be termed a second member, element, region, layer and/or part without departing from the teachings of the present invention.

DETAILED DESCRIPTION OF THE DRAWINGS

The present description includes, among other features, a conductive pad of a semiconductor die and a lead frame directly connected to each other using an electrochemically formed layer and/or a conductive adhesive layer made of the same metal with the lead frame. This eliminates the need for providing separate wire bonding or conductive bump structures, which require high cost. This also facilitates an electrical connection between the conductive pad of the semiconductor die and the lead frame, which saves costs and improves performance in high current applications.

In one embodiment, a semiconductor package includes a semiconductor die having a plurality of conductive pads, and a lead frame having a plurality of leads electrically connected to the plurality of conductive pads, respectively, wherein the lead frame further includes an electrochemically deposited layer provided on the plurality of leads and the plurality of leads are electrically connected to the plurality of conductive pads by the electrochemically deposited layer.

In another embodiment, a semiconductor package includes a semiconductor die having a first surface and a second surface opposite to the first surface and including a first conductive pad formed on its first surface, and a lead frame including a die pad electrically connected to the second surface of the semiconductor die and a first lead spaced apart from the die pad to outwardly extend and electrically connected to the first conductive pad of the semiconductor die, wherein the lead frame further includes a plated layer disposed on the first lead and the first lead is electrically connected to the first conductive pad through the plated layer.

In a further embodiment, a method for forming a semiconductor package includes providing a semiconductor die including a plurality of conductive pads, providing a lead frame having a plurality of leads, placing the plurality of conductive pads proximate to the plurality of leads, and forming a conductive layer to electrically connect the plurality of leads to the plurality of conductive pads. In a still further embodiment, forming the conductive layer includes electrochemically forming the conductive layer.

Various aspects of the present description can be embodied in different forms and should not be construed as being limited to the example embodiments set forth herein. Rather, these example embodiments of the disclosure are provided to convey various aspects of the disclosure to those of ordinary skill in the art.

Figure 1B:
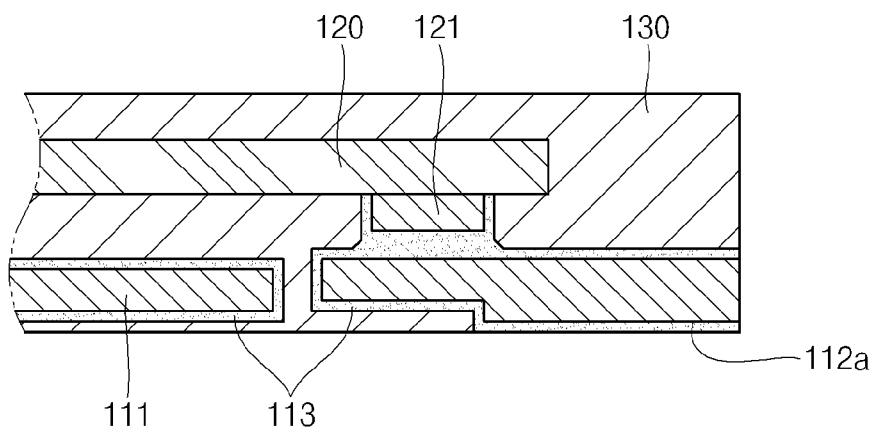

Referring to FIGS. 1A and 1B, a partial cross-sectional view and a partial enlarged cross-sectional view of a semiconductor package 100 according to a first embodiment are illustrated. As illustrated in FIG. 1, the semiconductor package 100 includes a lead frame 110, a semiconductor die 120, and an encapsulant 130.

In one embodiment, the lead frame 110 includes a die pad 111, tie bars (not shown), a plurality of leads 112, and an electrochemically formed layer 113, an electrochemically deposited layer 113, or a plated layer 113, such as an electroplated layer 113. The lead frame 110 has a first surface 110a and a second surface 110b opposite to the first surface 110a and, in one embodiment, can be made of copper. In accordance with the present embodiments, the electrochemically formed layer 113, which includes the plated layer 113, can be provided using an electrolyte solution with an external current source, such as an electroplating process, or without an external current source, such as an electroless plating process or a process using an autocatalytic plating solution.

In some embodiments, the die pad 111 is shaped of a substantially rectangular plate and has four sides and four corners. In one embodiment, the die pad 111 is formed such that the plated layer 113 formed by electrochemical deposition covers a first surface and a second surface opposite to the first surface. In one embodiment, the first surface of the die pad 111 can be substantially co-planar with the first surface 110a of the lead frame 110 and the second surface of the die pad 111 can be substantially co-planar with the second surface 110b of the lead frame 110. In one embodiment, the die pad 111 can be electrically connected to the semiconductor die 120 through the plated layer 113.

In one embodiment, the tie bars can outwardly protrude a predetermined length from the four corners of the die pad 111. In one embodiment, the tie bars can extend from the corners of the die pad 111 in outward and generally diagonal directions. The tie bars can be configured to maintain co-planarity of the lead frame 100.

In some embodiments, the plurality of leads 112 can be spaced apart from the four sides of the die pad 111 to be arranged in vertical directions to the respective sides of the die pad 111. That is, the plurality of leads 112 can be spaced apart from the die pad 111 and can be spaced apart from outer peripheral edges of the die pad 111. The plurality of leads 112 are spaced apart from each other to be electrically disconnected from each other. In one embodiment, a first surface of each of the plurality of leads 112 is a surface facing the same direction with the first surface of the die pad 111 and can be substantially co-planar with the first surface 110a of the lead frame 110. In addition, a second surface of each of the plurality of leads 112 is a surface facing the same direction with the second surface of the die pad 111 and can be substantially co-planar with the second surface 110b of the lead frame 110. In one embodiment, the plurality of leads 112 are formed such that the plated layer 113 formed by electrochemical deposition covers the first surface 110a and the second surface 110b. In accordance with the present embodiment, the plurality of leads 112 is electrically connected to the semiconductor die 120 through the plated layer 113.

In one embodiment, after the semiconductor die 120 is mounted on the first surface 110a, the plated layer 113 can then be formed to entirely cover the outer surface of the lead frame 110 by an electrochemical deposition process, such as electroplating or electroless plating.

In one embodiment, the semiconductor die 120 is shaped of a substantially flat plate and has a first surface 120a and a second surface 120b opposite to the first surface 120a. In one embodiment, the semiconductor die 120 includes a plurality of conductive pads 121 formed on the first surface 120a and can include a protection layer 122 formed to entirely cover the first surface 120a of the semiconductor die 120 so as to expose the plurality of conductive pads 121 to the outside. In some embodiments, the protection layer 122 can be made of an insulating material. The plurality of conductive pads 121 are made of a conductive material, such as copper or other materials as known to those of ordinary skill the art.

In accordance with the present embodiment, the semiconductor die 120 is mounted on the lead frame 110 such that the first surface 120a faces and is proximate to the first surface 110a of the lead frame 110. In some embodiments, the semiconductor die 120 can have a larger planar size than the die pad 111 as generally illustrated in FIGS. 1A and 1B.

In one embodiment, after the plurality of conductive pads 121 are mounted such that the plurality of leads 112 of the lead frame 110 face the die pad 111, the plated layer 113 is formed on the lead frame 110 by electrochemical deposition, thereby allowing the semiconductor die 120 to electrically connect the plurality of conductive pads 121 to the lead frame 110. The plurality of conductive pads 121 of the semiconductor die 120 is thus electrically connected to first sides of the plurality of leads 112 by the plated layer 113. In accordance with the present embodiment, portions of the plated layer 113 can be disposed adjoining at least portions of side or sidewall surfaces of the plurality of conductive pads 121 or surfaces thereof exposed to the electrochemical deposition process.

In accordance with one embodiment, the plated layer 113 can form outward from the lead frame 110 until it is connected to the plurality of conductive pads 121. In one embodiment, the first surface 120a of the semiconductor die 120, where the plurality of conductive pads 121 are not formed, may be electrically disconnected from the plated layer 113 by a protection layer 122 and/or an underfill layer, such as a molded underfill layer provided using encapsulant 130.

In one embodiment, the plated layer 113 is formed between the plurality of leads 112 of the lead frame 110 and the plurality of conductive pads 121 of the semiconductor die 120, thereby electrically connecting the plurality of leads 112 to the plurality of conductive pads 121 through the plated layer 113. In addition, in some embodiments the plated layer 113 can be formed between the die pad 111 of the lead frame 110 and the plurality of conductive pads 121 of the semiconductor die 120, thereby electrically connecting the die pad 111 to the plurality of conductive pads 121 through the plated layer 113.

In accordance with one embodiment, the plated layer 113 is interposed between the plurality of leads 112 of the lead frame 110 and the plurality of conductive pads 121 of the semiconductor die 120 and between the die pad 111 of the lead frame 110 and the plurality of conductive pads 121 of the semiconductor die 120, thereby electrically connecting the lead frame 110 to the semiconductor die 120. In one embodiment, the plated layer 113, the lead frame 110 and the plurality of conductive pads 121 of the semiconductor die 120 may be made of the same metal, for example, copper.

The encapsulant 130 encapsulates the lead frame 110 and the semiconductor die 120 to protect them from external environments. In one embodiment, the encapsulant 130 entirely covers the first surface 110a of the lead frame 110, on which the semiconductor die 120 is mounted, and the semiconductor die 120. In the plurality of leads 112 of the lead frame 110, first sides thereof connected to the plurality of conductive pads 121 can be positioned inside of the encapsulant 130 and second sides 112a can be exposed to the outside of the encapsulant 130. That is, in one embodiment a second surface of each of the second sides 112a of the plurality of leads 112 can be exposed to the outside of the encapsulant 130. In one embodiment, the second sides 112a of the plurality of leads 112 can be covered by the plated layer 113.

In accordance with the present embodiment, in the semiconductor package 100, the plurality of conductive pads 121 of the semiconductor die 120 and the lead frame 110 are directly connected to each other through the plated layer 113, which can be made of the same material as the plurality of conductive pads 121 and the lead frame 110, without separately providing wire bonding or conductive bumps requiring high costs, thereby facilitating an electrical connection between the conductive pads 121 of the semiconductor die 120 and the lead frame 110, saving the cost and improving performance in high current applications.

FIGS. 2A to 2D illustrate enlarged partial cross-sectional views of alternative embodiments to semiconductor package 100 of FIGS. 1A and 1B.

Each of the semiconductor packages 200, 300, 400 and 500 illustrated in FIGS. 2A to 2D can further include additional components in addition to a lead frame 110, a semiconductor die 120 and an encapsulant 130, compared to the semiconductor package 100 illustrated in FIG. 1A. Thus, the following description will focus on differences between the semiconductor package 100 illustrated in FIG. 1A and the semiconductor packages 200, 300, 400 and 500 illustrated in FIGS. 2A to 2D.

Figure 2A:
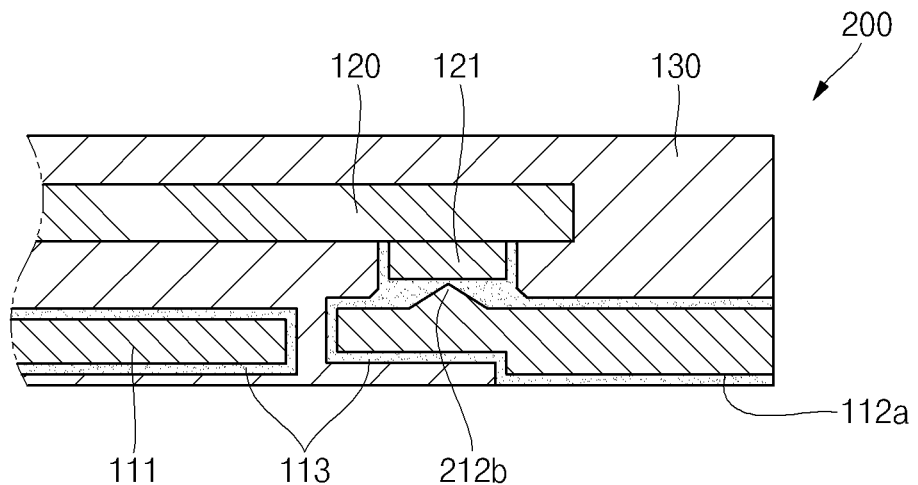
FIGS. 2A to 2D are enlarged partial cross-sectional views illustrating a semiconductor packages according to other embodiments of the present invention.

In accordance with the present embodiment, the semiconductor package 200 illustrated in FIG. 2A can further include protrusions 212b formed on the first surface 110a of the lead frame 110 facing the plurality of conductive pads 121 of the semiconductor die 120 with the protrusions protruding or extending generally toward the semiconductor die 120. In one embodiment, the protrusions 212b can be provided at locations of the first surface 110a of the lead frame 110, corresponding to the locations of the plurality of conductive pads 121 of the semiconductor die 120. In one embodiment, the protrusions 212b can be provided in the die pad 111 and the plurality of leads 112 to be electrically connected to the plurality of conductive pads 121 in the lead frame 110. In one embodiment, the protrusions 212b can be integrally formed with the lead frame 110 and can be formed at the same stage of forming the lead frame 110.

In one embodiment, the protrusions 212b can be covered by the plated layer 113 interposed between the lead frame 110 and the conductive pads 121. The protrusions 212b of the semiconductor package 200 can reduce a thickness of the plated layer 113 for electrically connecting the plurality of conductive pads 121 to the lead frame 110. That is, since the semiconductor package 200 illustrated in FIG. 2A includes the protrusions 212b, an electrical connection between the plurality of conductive pads 121 of the semiconductor die 120 and the lead frame 110 can be more facilitated even if the plated layer 113 is formed to have a smaller thickness than that of the semiconductor package illustrated in FIG. 1A.

Figure 2B:
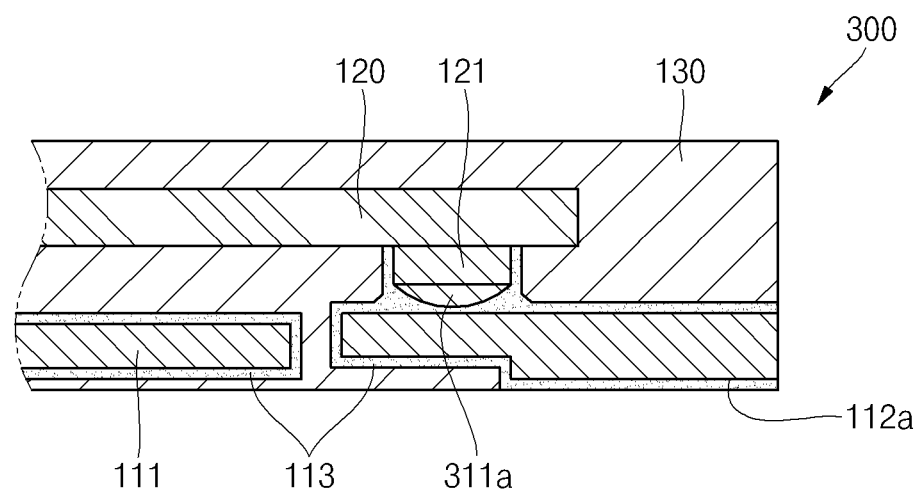

In accordance with the present embodiment, the semiconductor package 300 illustrated in FIG. 2B can further include stud bumps 311a provided in the plurality of conductive pads 121 of the semiconductor die 120. The stud bumps 311a can be made of a conductive material and can be formed on the plurality of conductive pads 121 of the semiconductor die 120. The stud bumps 311a can protrude from the plurality of conductive pads 121 toward one or more of the lead frames 110.

In accordance with the present embodiment, the stud bumps 311a are covered by the plated layer 113 interposed between the lead frame 110 and the conductive pads 121. The stud bumps 311a of the semiconductor package 300 can reduce a thickness of the plated layer 113 for electrically connecting the plurality of conductive pads 121 to the lead frame 110. That is, since the semiconductor package 300 illustrated in FIG. 2B includes the stud bumps 311a, an electrical connection between the plurality of conductive pads 121 of the semiconductor die 120 and the lead frame 110 can be more facilitated even if the plated layer 113 is formed to have a smaller thickness than that of the semiconductor package illustrated in FIG. 1A.

Figure 2C:
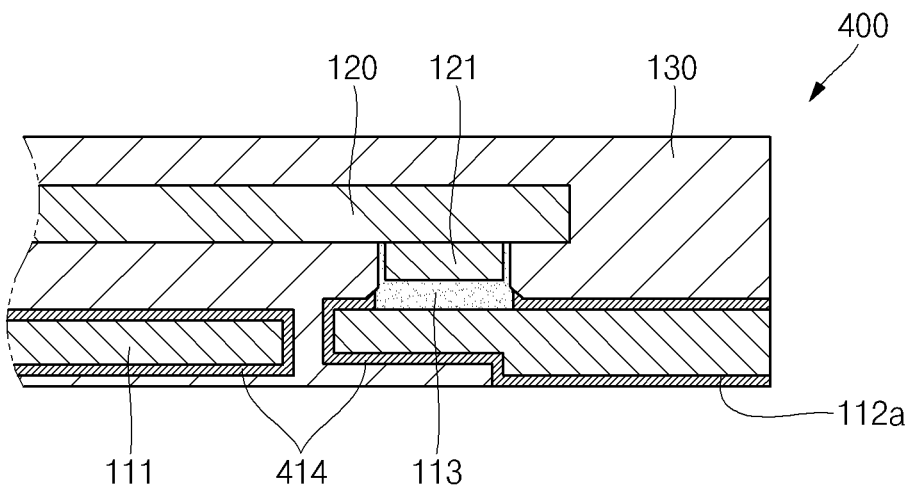

In accordance with the present embodiment, the semiconductor package 400 illustrated in FIG. 2C can further include an insulation layer 414 formed to cover a region or portions of the lead frame 110, other than the regions or portions corresponding to the plurality of conductive pads 121 of the semiconductor die 120. The insulation layer 414 can be formed on a first surface 110a of the lead frame 110 so as to expose only the regions corresponding to the plurality of conductive pads 121 to the outside.

In the lead frame 110, after the semiconductor die 120 is mounted, the plated layer 113 can be formed by electrochemical deposition only at the regions of the lead frame 110 exposed to the outside through the insulation layer 414. In one embodiment, since the semiconductor package 400 includes the insulation layer 414, the plated layer 113 is formed only at the regions of the lead frame 110, corresponding to the plurality of conductive pads 121 of the semiconductor die 120, thereby preventing the plated layer 113 from being unnecessarily formed.

Figure 2D:
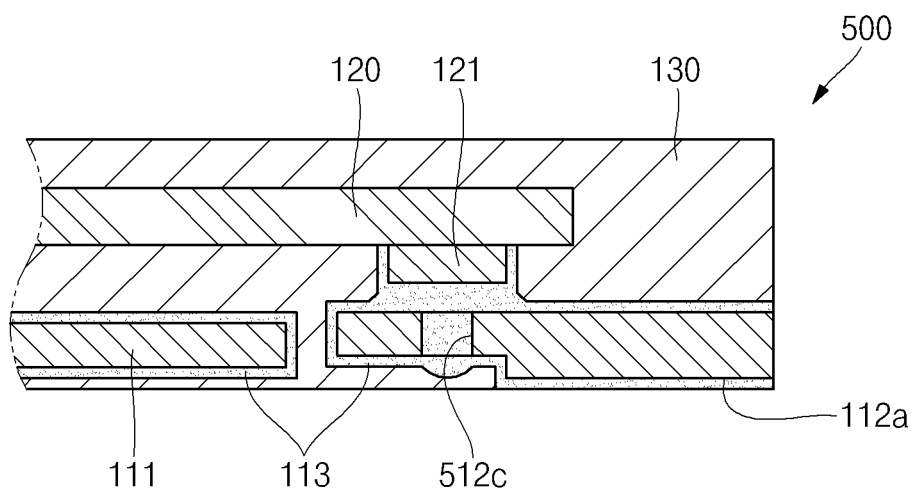

In accordance with the present embodiment, the semiconductor package 500 illustrated in FIG. 2D can further include a plurality of through-holes 512c passing through a region between the first surface 110a and the second surface 110b of the lead frame 110, corresponding to each of the plurality of conductive pads 121 of the semiconductor die 120. In one embodiment, the inside of each of the through-holes 512c can be filled with the plated layer 113. In one embodiment, in the lead frame 110, the plurality of through-holes 512c can be formed in the die pad 111 and the plurality of leads 112, and the inside of each of the through-holes 512c can be filled with the plated layer 113.

Since the plated layer 113 of the lead frame 110 is formed inside the through-hole 512c, formation of the plated layer 113 can be better facilitated in other planar regions of the lead frame 110.

In accordance with the present embodiment, since the semiconductor package 500 includes the through-holes 512c formed in the regions corresponding to the plurality of conductive pads 121, the formation of the plated layer 113 increases in the regions where the through-holes 512c are formed even if the plated layer 113 is formed to have a smaller thickness than the plated layer 113 of the semiconductor package 100 illustrated in FIG. 1A. Therefore, according to the semiconductor package 500, electrical connections between the lead frame 110 and the plurality of conductive pads 121 can be more facilitated even with a reduced thickness of the plated layer 113, compared to a case of the semiconductor package 100 illustrated in FIG. 1A.

Figure 3A:
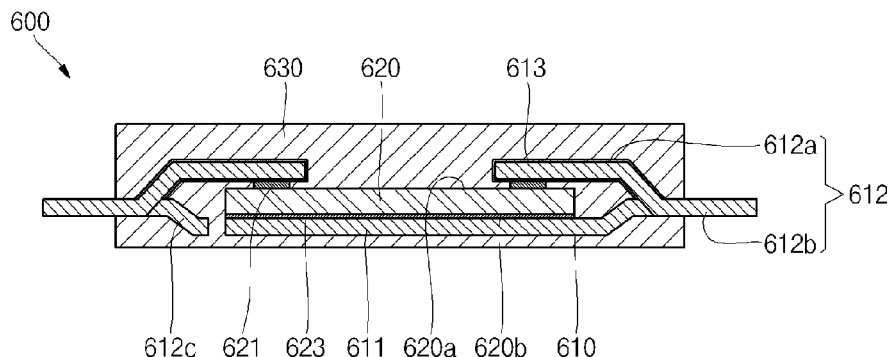
FIGS. 3A and 3B are a partial cross-sectional view and a perspective view illustrating a semiconductor package according to another embodiment of the present invention.
Figure 3B:
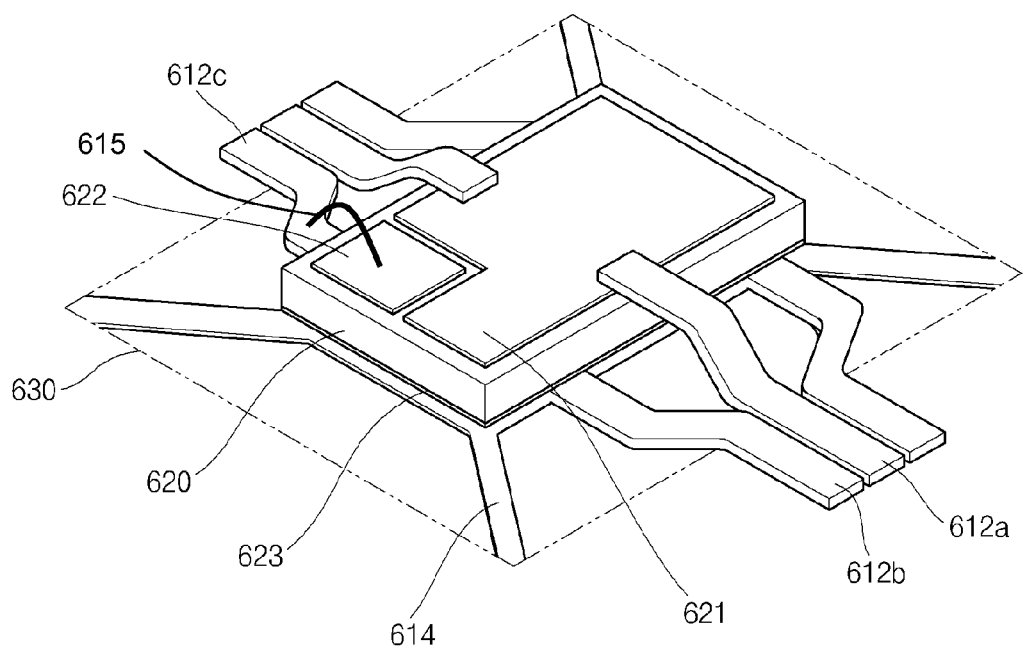

FIGS. 3A and 3B are a partial cross-sectional view and a perspective view illustrating a semiconductor package 600 according to another embodiment.

As illustrated in FIGS. 3A and 3B, in one embodiment the semiconductor package 600 includes a lead frame 610, a semiconductor die 620 and an encapsulant 630. In one embodiment, the lead frame 610 includes a die pad 611, tie bars 614, a plurality of leads 612 and a plated layer 613. The lead frame 610 has a first surface 610a and a second surface 610b opposite to the first surface 610a. In one embodiment lead frame 610 can be made of copper.

In one embodiment, the die pad 611 can have the shape of a substantially rectangular plate with four sides and four corners. In one embodiment, a first surface of the die pad 611 can be substantially co-planar with the first surface 610a of the lead frame 610 and the second surface of the die pad 611 can be substantially co-planar with the second surface 610b of the lead frame 610.

The tie bars 614 can protrude outwardly a predetermined length from the four corners of the die pad 611. The tie bars can extend from the corners of the die pad 611 in outward and generally diagonal directions. The tie bars can be configured to maintain co-planarity of the lead frame 600.

Each of the plurality of leads 612 can include a first lead 612a having one side spaced apart from the first surface 610a of the die pad 611 to be generally parallel with the first surface 610a, a second lead 612b extending from the die pad 611 and a third lead 612c spaced apart from one side of the die pad 611. The plurality of first leads 612a, the plurality of second leads 612b and the plurality of third leads 612c can be spaced apart from each other to be electrically disconnected from each other. In accordance with the present embodiment, the plurality of first leads 612a is electrically connected to the semiconductor die 620 through the plated layer 613.

In the lead frame 610, after the semiconductor die 620 is mounted on the first surface 610a, the plated layer 613 can be formed to entirely cover the outer surface of the lead frame 610 by an electrochemical deposition process, such as an electroplating process, an electroless plating process, or other similar techniques as known to those of ordinary skill in the art.

In one embodiment, the semiconductor die 620 has the shape of a substantially flat plate and has a first surface 620a and a second surface 620b opposite to the first surface 620a. The semiconductor die 620 can include a plurality of first conductive pads 621 formed on a first surface 620a and a protection layer (not shown) formed to entirely cover the first surface 620a of the semiconductor die 620 so as to expose the plurality of first conductive pads 621 to the outside. The plurality of first conductive pads 621 can be made of copper or other materials as known to those of ordinary skill in the art.

In one embodiment, the semiconductor die 620 can be a high power semiconductor device, such as an insulated gate bipolar transistor (IGBT) or a field effect transistor (FET). In one embodiment, the semiconductor die 620, which is configured as the high power semiconductor device, includes a first electrode, a second electrode and a control electrode. In the semiconductor die 620 as the high power semiconductor device, a high current can flow between the first electrode and the second electrode by a voltage applied to the control electrode.

In the semiconductor die 620 configured as the high power semiconductor device, the first conductive pad 621 formed on the first surface 620a can be a first electrode, and a second conductive pad (not shown) formed on the second surface 620b of the semiconductor die 620 can be a second electrode. Additionally, a third conductive pad 622 electrically disconnected from the plurality of first conductive pads 621 can further be provided on the first surface 620a of the semiconductor die 620. The third conductive pads 622 can be a control electrode.

The semiconductor die 620 is mounted on the first surface 610a of the die pad 611. In addition, the second surface 620b of the semiconductor die 620 can be electrically connected to the first surface 610a of the die pad 611 through a solder 623. The semiconductor die 620 and the die pad 611 can be electrically connected to each other through the plated layer 613, instead of the solder 623. In order to allow the plated layer 613 to be easily interposed between the semiconductor die 620 and the die pad 611, a plurality of through-holes each passing through a portion between the first and second surfaces 610a and 610b of the die pad 611 can be used in some embodiments.

As described above, the second conductive pad of the semiconductor die 620 is electrically connected to the die pad 611. In addition, each of the second leads 612b extending from the die pad 611 can have a first side connected to the die pad 611 and a second side exposed to the outside of the encapsulant 630.

The first conductive pad 621 of the semiconductor die 620 is electrically connected to the first leads 612a of the lead frame 610. The plated layer 613 can further be interposed between the first leads 612a and the first conductive pad 621.

After the semiconductor die 620 is mounted on the die pad 611, the plated layer 613 can be formed by electrochemical formation to be disposed in spaces between the first leads 612a and the plurality of first conductive pads 621, thereby electrically connecting the first leads 612a to the first conductive pad 621. That is to say, the plated layer 613 can be formed until the first leads 612a are connected to the first conductive pad 621. In FIGS. 3A and 3B, the plated layer 613 is formed only on the first leads 612a. However, in other embodiments, the plated layer 613 can be formed by entirely plating the lead frame 610 to a predetermined thickness. The plated layer 613 and the first conductive pad 621 can be made of the same metal, for example, copper.

The first leads 612a each having a first side connected to the first conductive pad 621 formed on the first surface 620a of the semiconductor die 620 and the second leads 612b each having a first side connected to the second conductive pad (not shown) formed on the second surface 620b of the semiconductor die 620 can be substantially co-planar. In one embodiment, the second side of each of the first leads 612a is bent toward the second leads 612b and the second side of each of the second leads 612b is bent toward the first leads 612a, so that the second side of the first leads 612a and the second side of the second leads 612b can be substantially co-planar. In addition, the third conductive pad 623 of the semiconductor die 620 can be electrically connected to the third lead 612c through a conductive wire 615. In FIGS. 3A and 3B, the third conductive pad 622 is connected to the third lead 612c through the conductive wire 615, but aspects of the present disclosure are not limited thereto.

The third conductive pad 622 of the semiconductor die 620 and the third lead 612c can be connected to each other through the plated layer 613. In order to connect the third conductive pad 622 of the semiconductor die 620 to the third lead 612c through the plated layer 613, in one embodiment, the third lead 612c and the first leads 612a can have the same shape.

In FIGS. 3A and 3B, the third lead 612c and the second lead 612b have substantially the same shape, except that the first sides of the third lead 612c and the second lead 612b are spaced apart from each other by the die pad 611, and third lead 612c can be electrically disconnected from the die pad 611. In one embodiment, the second side of the third lead 612c can protrude to the outside of the encapsulant 630. In one embodiment, the second sides of the first lead 612a, the second lead 612b and the third lead 612c can be exposed to the outside of the encapsulant 630 and can be positioned in a substantially co-planar manner.

In some embodiment, the encapsulant 630 encapsulates the lead frame 610 and the semiconductor die 620 to protect them from external environments. In one embodiment, the encapsulant 630 entirely covers the lead frame 610, on which the semiconductor die 620 is mounted, and the semiconductor die 620. In one embodiment, the first sides of the leads 612 of the lead frame 610 connected to the semiconductor die 620 can be positioned inside the encapsulant 630 and second sides of the leads 612 can protrude to the outside of the encapsulant 630. That is, second sides of the first leads 612a, the second leads 612b and the third leads 612c can protrude to the outside of the encapsulant 630 and can be positioned in a substantially co-planar manner.

In the semiconductor package 600, when the semiconductor die 620 is a high power semiconductor device, it is, in accordance with the present embodiment, directly connected to the lead frame 610 through the plated layer 613, thereby preventing wire damages due to a high current. In addition, in one embodiment the semiconductor die 620 and the lead frame 610 are connected to each other through the plated layer 613 made of the same material with the plurality of first conductive pads 621 and the lead frame 610 without separately providing wire bonding or conductive bumps requiring high costs, thereby facilitating an electrical connection between the plurality of first conductive pads 621 and the lead frame 610 and saving the cost.

Figure 4:
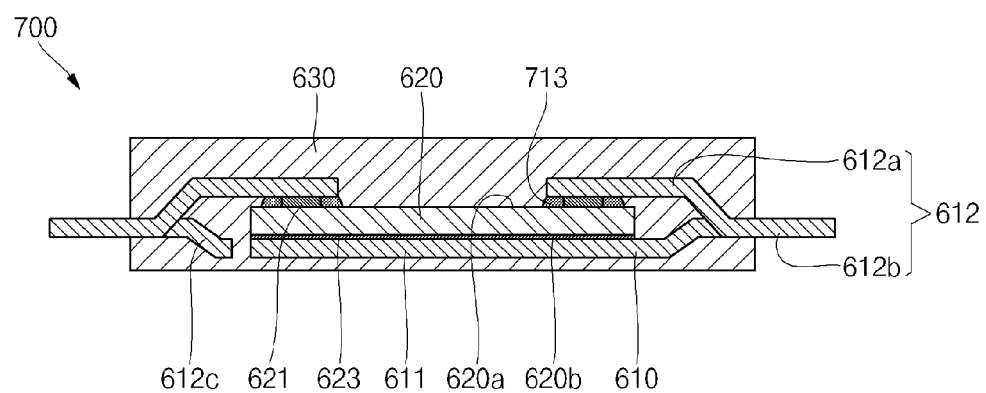
FIG. 4 is a cross-sectional view illustrating a semiconductor package according to another embodiment of the present invention.

FIG. 4 is a cross-sectional view illustrating a semiconductor package 700 according to another embodiment.

As illustrated in FIG. 4, the semiconductor package 700 includes a lead frame 610, a semiconductor die 620 and an encapsulant 630. The semiconductor package 700 illustrated in FIG. 4 and the semiconductor package 600 illustrated in FIGS. 3A and 3B have substantially the same configuration, except for a connection configuration between the lead frame 610 and the semiconductor die 620.

In one embodiment, the first conductive pad 621 of the semiconductor die 620 can be electrically connected to first leads 612a of the lead frame 610 through a conductive adhesive layer 713. In one embodiment, the conductive adhesive layer 713 and the first conductive pad 621 can include the same metal, for example, copper and an adhesive.

In one embodiment, the conductive adhesive layer 713 can be formed by applying an adhesive to portions between the first conductive pad 621 of the semiconductor die 620 and the first leads 612a of the lead frame 610 and curing the adhesive by sintering, thereby adhering the semiconductor die 620 and the lead frame 610 to each other.

In the semiconductor package 700, when the semiconductor die 620 is a high power semiconductor device, it can be directly connected to the lead frame 610 through the plated layer 613 (illustrated in FIG. 3A), thereby preventing wire damage due to a high current. In addition, the semiconductor die 620 and the lead frame 610 can be connected to each other through the conductive adhesive layer 713 made of the same material with the first conductive pad 621 and the lead frame 610 without separately providing wire bonding or conductive bumps requiring high costs, thereby facilitating an electrical connection between the plurality of first conductive pads 621 and the lead frame 610 and saving manufacturing costs.

From all of the foregoing, one skilled in the art can determine that according to another embodiment, a semiconductor package includes a semiconductor die having a first surface and a second surface opposite to the first surface and including a first conductive pad formed on its first surface. A lead frame including a die pad is electrically connected to the second surface of the semiconductor die and a first lead spaced apart from the die pad to outwardly extend and electrically connected to the first conductive pad of the semiconductor die. A conductive adhesive layer interposed between the lead of the lead frame and the first conductive pad.

From all of the foregoing, one skilled in the art can determine that according to a further embodiment, the semiconductor die is an insulated gate bipolar transistor (IGBT) or a field effect transistor (FET) as a high power semiconducting device. In a still further embodiment, the semiconductor package can further include an encapsulant encapsulating the semiconductor die, a first surface of the die pad, on which the semiconductor die is mounted, and a first side of the first lead connected to the conductive pad. In another embodiment, the conductive adhesive layer can be cured by sintering.

While the present invention has been particularly illustrated and described with reference to exemplary embodiments thereof, it will be understood by those of ordinary skill in the art that various changes in form and details can be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A semiconductor package comprising:
a semiconductor die having a major surface and including a conductive pad disposed adjacent and overlapping the major surface, the conductive pad having a first bonding surface spaced apart from the major surface and a sidewall bonding surface extending from the first bonding surface toward the major surface;
a lead including a first region adjacent the semiconductor die and a second region laterally extending away from the first region, wherein the first region has a lead sidewall surface laterally spaced inward from the sidewall bonding surface of the conductive pad, and wherein the first region of the lead faces and overlaps the first bonding surface of the conductive pad;

a conductive layer affixed to the first bonding surface of the conductive pad, affixed to the sidewall bonding surface of the conductive pad, affixed to the first region, and affixed to the lead sidewall surface thereby electrically connecting the conductive pad to the lead, wherein a first portion of the conductive layer is interposed between the first bonding surface of the conductive pad and the first region of the lead; and an encapsulant covering the semiconductor die and at least portions of the lead, wherein:

the first region of the lead is thinner than the second region of the lead;

the first region includes a first region first surface and a first region second surface opposite to the first region first surface;

the lead sidewall surface extends between the first region first surface and the first region second surface;

the second region includes a second region first surface contiguous with the first region first surface and a second region second surface opposite to the second region first surface;

the conductive layer comprises a continuous conductive layer affixed to the first region first surface, the lead sidewall surface, the first region second surface, and the second region second surface;

the continuous conductive layer affixed to the first region second surface is covered by the encapsulant; and the continuous conductive layer affixed to the second region second surface is exposed to the outside of the encapsulant.

2. The semiconductor package of claim 1, wherein the first region further comprises a protrusion protruding towards the conductive pad.

3. The semiconductor package of claim 2, wherein the conductive layer covers the protrusion.

4. The semiconductor package of claim 1, wherein:

the lead includes a through-hole in the first region corresponding to the conductive pad, the through-hole passing through the first region between a first surface and a second surface opposite to the first surface, and the through-hole is filled with the conductive layer.

5. The semiconductor package of claim 1, wherein:

the conductive pad further includes a stud bump disposed adjacent the first bonding surface and protruding towards the lead, and wherein the conductive layer is affixed to all exposed surfaces of the stud bump.

6. The semiconductor package of claim 5, wherein:

the conductive layer has a non-uniform thickness between the stud bump and the first region of the lead.

7. The semiconductor package of claim 1, further comprising:

a die pad shaped of a rectangular plate, wherein:

the conductive layer comprises one of an electroplated layer or an electroless plated layer;

the first region of the lead is thinner than the second region of the lead;

the first region includes a first region first surface and a first region second surface opposite to the first region first surface;

the lead sidewall surface extends between the first region first surface and the first region second surface;

the second region includes a second region first surface contiguous with the first region first surface and a second region second surface opposite to the second region first surface; and the conductive layer comprises a continuous conductive layer affixed to the first region first surface, the lead sidewall surface, the first region second surface, and the second region second surface.

8. The semiconductor package of claim 1, wherein:

the lead, the conductive pad, and the conductive layer comprise the same metal, and wherein a second portion of the conductive layer is affixed to the second region of the lead, and wherein the first portion is thicker than the second portion.

9. A semiconductor package comprising:

a semiconductor die having a first surface and a second surface opposite to the first surface and including a first conductive pad disposed adjacent to and overlapping the first surface, the first conductive pad having a first bonding surface spaced apart from the first surface and a sidewall bonding surface extending from the first bonding surface toward the first surface;

a lead comprising a first region adjacent the first surface of the semiconductor die and a second region laterally extending away from the first region, wherein the first region has a lead sidewall surface laterally spaced inward from the sidewall bonding surface of the first conductive pad, and wherein the first region overlaps the first bonding surface of the first conductive pad, and wherein the first region is thinner than the second region;

an electrochemically deposited conductive layer affixed to the first bonding surface of the first conductive pad, affixed to the sidewall bonding surface of the first conductive pad, affixed to the first region, affixed to at least a portion of the second region, and affixed to the lead sidewall surface thereby electrically connecting the first conductive pad to the lead, wherein a first portion of the electrochemically deposited conductive layer is interposed between the first bonding surface of the first conductive pad and the first region of the lead; and an encapsulant encapsulating the semiconductor die, wherein:

the first region of the lead includes a first region first surface and a first region second surface opposite to the first region first surface;

the lead sidewall surface extends between the first region first surface and the first region second surface;

the second region of the lead includes a second region first surface contiguous with the first region first surface and a second region second surface opposite to the second region first surface;

the electrochemically deposited conductive layer comprises a continuous conductive layer affixed to the first region first surface, the lead sidewall surface, the first region second surface, and the second region second surface;

the continuous conductive layer affixed to the first region second surface is covered by the encapsulant; and the continuous conductive layer affixed to the second region second surface is exposed to the outside of the encapsulant.

10. The semiconductor package of claim 9, wherein:

a portion of the electrochemically deposited conductive layer is thicker in the first region than in the second region.

11. The semiconductor package of claim 9, further comprising:
 a die pad, wherein the electrochemically deposited conductive layer is interposed between the first surface of the semiconductor die and the die pad, and wherein the electrochemically deposited conductive layer comprises one of an electroplated layer or an electroless plated layer.

12. The semiconductor package of claim 9, wherein:
 the first conductive pad further includes a conductive bump interposed between the first conductive pad and the lead; and
 the electrochemically deposited conductive layer is interposed between the lead and the first conductive pad so as to entirely cover outer surfaces of the conductive bump.

13. A semiconductor package comprising:
 a semiconductor die having a first surface and a second surface opposite to the first surface and including a first conductive pad disposed adjacent to and overlapping the first surface, the first conductive pad having a first bonding surface spaced apart from the first surface and a sidewall bonding surface extending from the first bonding surface toward the first surface;
 a lead comprising a first lead surface, an opposing second lead surface, and a lead sidewall extending between the first lead surface and second lead surface, wherein the lead sidewall surface is laterally spaced inward from the sidewall bonding surface of the first conductive pad, and wherein the lead overlaps the first bonding surface of the first conductive pad, and wherein the second lead surface includes a recessed portion;
 a conductive layer affixed to the first bonding surface of the conductive pad, affixed to the sidewall bonding surface of the conductive pad, and affixed to the lead including the lead sidewall surface and the recessed portion; and
 an encapsulant encapsulating the semiconductor die and portions of the lead,
 wherein:
 the conductive layer comprises a continuous conductive layer further affixed to the second lead surface;
 the continuous conductive layer affixed to the second lead surface is exposed to the outside of the encapsulant; and
 the encapsulant encapsulates the continuous conductive layer affixed to the recessed portion.

14. The semiconductor package of claim13, wherein:
 the first conductive pad further includes a conductive bump connected to the first conductive pad and protruding towards the first lead surface; and
 the conductive layer is interposed between the first lead surface and the first conductive bump so as to entirely cover an outer surface of the conductive bump.

\* \* \* \* \*